United States Patent
Devoe et al.

(10) Patent No.: US 6,917,509 B1
(45) Date of Patent: Jul. 12, 2005

(54) SINGLE LAYER CAPACITOR WITH DISSIMILAR METALLIZATIONS

(76) Inventors: Daniel F. Devoe, 1106 Barcelona, San Diego, CA (US) 92107; Lambert Devoe, 3446 Stadium Pl., San Diego, CA (US) 92122; Alan D. Devoe, 5715 Waverly Ave., La Jolla, CA (US) 92037

( * ) Notice: Subject to any disclaimer, the term of this patent is extended or adjusted under 35 U.S.C. 154(b) by 413 days.

(21) Appl. No.: 10/301,335

(22) Filed: Nov. 21, 2002

(51) Int. Cl.[7] .......................... H01G 4/228; H01G 4/06; H01G 4/008
(52) U.S. Cl. .................. 361/309; 361/311; 361/305
(58) Field of Search ...................... 361/303–305, 361/306.1, 306.3, 309–312

(56) References Cited

U.S. PATENT DOCUMENTS

| | | | | |
|---|---|---|---|---|
| 3,275,915 A | * | 9/1966 | Harendza-Harinxma | 361/322 |
| 3,523,224 A | * | 8/1970 | Randall, Jr. et al. | 361/322 |
| 4,168,519 A | * | 9/1979 | Hertz | 361/304 |
| 4,439,813 A | | 3/1984 | Dougherty et al. | 361/321 |
| 4,819,128 A | | 4/1989 | Florian et al. | 361/321 |
| 4,864,465 A | | 9/1989 | Robbins | 361/320 |
| 5,177,663 A | | 1/1993 | Ingleson et al. | 361/321 |
| 5,220,483 A | | 6/1993 | Scott | 361/313 |
| 5,353,498 A | | 10/1994 | Fillion et al. | 29/840 |
| 5,576,926 A | | 11/1996 | Monsorno | 361/303 |
| 5,590,016 A | | 12/1996 | Fujishiro et al. | 361/313 |
| 5,599,414 A | | 2/1997 | Roethlingshoefer et al. | 156/89 |
| 5,712,758 A | | 1/1998 | Amano et al. | 361/321.2 |
| 5,757,611 A | | 5/1998 | Gurovich et al. | 361/321.4 |
| 5,855,995 A | | 1/1999 | Haq et al. | 428/210 |
| 6,125,027 A | * | 9/2000 | Klee et al. | 361/320 |
| 6,455,453 B1 | | 9/2002 | Chikagawa | 501/120 |

OTHER PUBLICATIONS

American Technical Ceramics, *ATC Millimeter Wavelength Single Layer Capacitors*, Brochure, 3 pp., Revised Feb. 1998.
Compex Corp, *MICROWAVE Chip Capacitors*, Brochure, 3 pp. publication date unknown.

* cited by examiner

*Primary Examiner*—Eric W. Thomas
(74) *Attorney, Agent, or Firm*—Wood, Herron & Evans, LLP

(57) ABSTRACT

A single layer ceramic capacitor for wire bonding or solder or epoxy attachment wherein a bottom metallization is of a lesser purity than a top metallization whereby the bottom metallization may be effectively soldered without leaching of the metal and the top metallization may be wire bonded. In an exemplary embodiment, the top metallization is essentially pure gold and the bottom metallization is an alloy of gold and platinum and/or palladium. The top and bottom metallizations are provided on a dielectric body that advantageously comprises a ceramic having a sintering temperature below the melting point of gold. In a further exemplary embodiment, the capacitance of the capacitor may be enhanced by providing one or more interior metallization planes parallel to the exterior metallizations and connected thereto by conductive vias.

25 Claims, 1 Drawing Sheet

SINGLE LAYER CAPACITOR WITH DISSIMILAR METALLIZATIONS

FIELD OF THE INVENTION

This invention relates to single layer capacitors having dissimilar thick film conductors.

BACKGROUND OF THE INVENTION

Existing "parallel plate" or "single layer" chip capacitors are built with two parallel conductive plates, or thick film conductors, separated by a single, insulating dielectric layer that is typically made of ceramic. These single layer ceramic capacitors have a very useful form factor which renders them suitable for automated assembly into microwave frequency circuits and similar applications. Dimensions of the chip capacitors can be matched to the width of the strip lines upon which the capacitors are mounted and to which the capacitors electrically connect.

In assembly, the bottom face of the chip capacitor is typically soldered or conductive epoxy attached to a conductive surface or pad. The top face of the chip capacitor is typically ribbon or wire bonded to another connection point. Most chip capacitors have been made by metallizing opposing faces of a thin sheet of sintered ceramic. For example, gold plating is a common practice. The metallized sheet is then cut into small chip bodies by sawing or by abrasive cutting techniques.

Historically, the dielectric ceramic has been chosen for its electrical properties, with the most common material being barium titanate. In pure form, barium titanate sinters at about 1300° C. For a single capacitor, sputtering, plating or printing techniques are used to form the electrodes after the dielectric has been sintered. However, to make a multilayer capacitor where the electrodes are buried inside the chip, the electrodes are formed before the dielectric is sintered such that the ceramic must be combined with an electrode material that will not melt or oxidize at the ceramic sintering temperature. Of the four metals that will fire in air without oxidizing, namely Pt, Pd, Au and Ag, only Pt and Pd have melting points (1768° C. and 1554° C., respectively) greater than the sintering temperature. Thus, multilayer capacitors were made with pure Pd or Pt for the internal electrode plates. Eventually, however, the cost of these metals became prohibitive, such that there was a need for developing multilayer capacitors having electrodes made of alloys of these metals with Ag, which was considerably cheaper. The Ag addition, however, lowered the melting point of the electrode materials to below the sintering temperature. For example, an alloy of 70% Ag and 30% Pd has a melting point of 1150° C. So, to be able to use alloyed electrodes, the sintering temperature of the ceramic had to be lowered.

The "ultra low firing" dielectric approach, or the so-called ULF approach, is an outgrowth of traditional thick film ceramics, where materials are fired at temperatures on the order of about 880° C. to 960° C. None of the actual core materials are capable of sintering at these temperatures, but in the process they are mixed with a glass frit, which allows them to densify into a composite matrix having the desired properties of conductors, resistors or insulators.

These new ULF dielectrics sinter at less than the melting points of pure gold and silver, which are about 1064° C. and 961° C., respectively, and at less than the melting points of the AgPt and AgPd alloys. Thus, the ULF approach became useful for the production of multilayer capacitors made using pure gold, pure silver or alloyed internal electrodes.

Single layer capacitors, as opposed to multilayer capacitors, are typically mounted by wire bonding to the top metallization, and the bottom metallization is either conductive epoxy bonded or soldered. The wires used for wire bonding are typically pure gold or silver, and the best bonding results are obtained by bonding pure gold wires to pure gold electrodes and pure silver wires to pure silver electrodes. Pure metals wire bond well, whereas alloys do not. In particular, alloy additions to gold increase the hardness, thereby decreasing the reliability of the bond. Thus, the alloyed internal electrodes used in multilayer capacitors are not applicable to the top metallization of single layer capacitors. However, while very pure gold and pure silver (about 99.9%) wire bond well and can be epoxy bonded, if solder is used for the bottom connection, which is generally preferred, the molten solder will leach the gold or silver bottom metallization off the chip thereby causing a reliability problem for the capacitor. Pt and Pd, on the other hand, do not leach into solder. The Au-Sn eutectic solder is the most common solder due to its good electrical performance, but it does exhibit this tendency to leach pure gold and silver under reflow conditions.

To solve this problem, single layer capacitors have been made by sputtering gold over titanium over tungsten or by plating gold over nickel. Both sides of the chip may be wire bonded or soldered because the pure gold layer wire bonds well, and while the gold is leached into the solder, the leaching stops at the titanium or nickel layer. Therefore, multiple metal layers are needed for the metallizations if pure gold or silver top and bottom metallizations are desired, which adds to the cost of manufacturing the capacitors.

Thus, while the introduction of the ULF approach provides an advancement in the production of multilayer capacitors due to its ability to sinter at a temperature less than the melting point of desirable electrode materials, there still exists a need for reliable bonding of gold or silver metallized single layer capacitors via wire bonding and solder attachment without the above-described problem of leaching, and a method for efficiently producing single layer capacitors.

SUMMARY OF THE INVENTION

The present invention provides a single layer capacitor for wire bonding and solder attachment wherein a bottom gold or silver metallization may be effectively soldered without leaching of the gold or silver. To this end, the bottom metallization is of a lesser purity than the top metallization. In an exemplary embodiment, the top metallization is essentially pure gold or silver and the bottom metallization is an alloy of gold or silver with platinum and/or palladium. In an exemplary embodiment, the top and bottom metallizations are provided on a dielectric body that comprises a ceramic having a sintering temperature below the melting point of the metallizations. Further, the dissimilar metallizations may be applied to a dielectric body that is either in the green state or the fired state.

In a further exemplary embodiment of the present invention, the capacitance of the capacitor may be enhanced by providing at least one interior metallization plane, and preferably one or more pairs of interior metallization planes, that are parallel to the exterior metallizations and connected thereto by vias, preferably by multiple vias.

BRIEF DESCRIPTION OF THE DRAWINGS

The accompanying drawings, which are incorporated in and constitute a part of this specification, illustrate embodi

DETAILED DESCRIPTION

Figure 1:
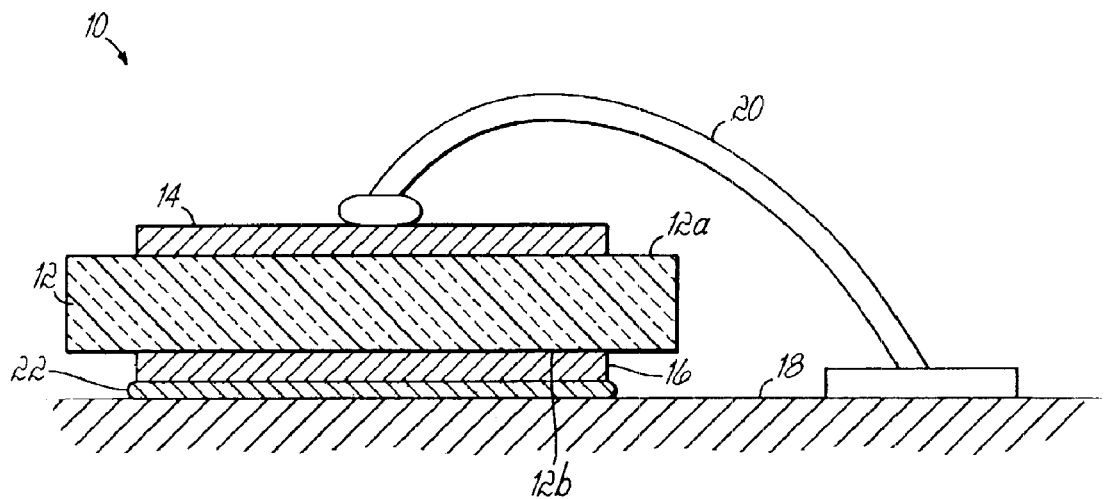
- FIG. 1 is a cross-sectional view of a single layer capacitor of the present invention mounted on a substrate.

Referring to the drawings, in which like numerals are used throughout to refer to like parts, FIG. 1 depicts in cross-section a capacitor 10 of the present invention. Capacitor 10 includes a dielectric body 12, which includes top and bottom opposed coplanar surfaces 12a and 12b, respectively. A top exterior metallization 14 is applied on at least a portion of the top coplanar surface 12a and a bottom exterior metallization 16 is applied on at least a portion of the bottom coplanar surface 12b. The top metallization 14 comprises a material suitable for wire bonding and a bottom metallization 16 comprises a material suitable for either solder or epoxy bonding. In general, essentially pure metals are suitable for wire bonding and alloys are suitable for solder bonding. The exterior metallizations 14 and 16 may be applied by printing a film onto the dielectric body in a green state, or may be sputtered onto the dielectric body in a fired state. Because the exterior metallizations 14 and 16 are dissimilar and designed to be suitable for their respective bonding techniques, only a single metallization layer is needed for each electrode rather than the multiple layers used in the past, e.g., gold plated on nickel.

In an exemplary embodiment of the present invention, bottom metallization 16 comprises a gold-based material of lesser purity than a top gold-based metallization 14. Gold has become the standard in the electronics industry for the wire bonds and capacitor electrodes. Alloying additions to gold, in particular additions of platinum and/or palladium, provide leach resistance to the bottom metallization 16, which is necessary to prevent leaching of the gold into the molten solder under reflow conditions. However, alloying additions to gold increase the hardness of the metallization, which is undesirable for wire bonding of the top metallization 14. Therefore, the top metallization 14 advantageously comprises less than about 1% non-gold elements, i.e., top metallization 14 is essentially pure gold. Gold of 99.9% purity is particularly effective for wire bonding with gold wire. The bottom metallization 16 comprises gold and an alloying element in an amount sufficient to substantially prevent leaching of the gold into the solder, the amount being at least about 1%, and advantageously at least about 10%. The bottom metallization 16 advantageously comprises about 80–99% gold and about 1–20% platinum, palladium, or a combination of platinum and palladium. A gold alloy comprising about 10–20% platinum and/or palladium is particularly effective in providing leach resistance for the bottom metallization 16. However, it should be understood that any other metal may be alloyed with gold if that alloying metal may be added in an amount sufficient to substantially prevent leaching of the bottom metallization 16 by a molten solder in contact with the metallization 16.

In a further exemplary embodiment of the present invention, capacitor 10 includes a dielectric body 12 that comprises a ceramic that sinters at less than the melting point of the electrode materials, which for a pure gold metallization would be less than 1064° C. As described above, such ceramics are known as low temperature firing dielectrics or ultra-low firing (ULF) dielectrics, and they generally fire between about 880° C. and 960° C. as a result of the inclusion of glass frit in the ceramic composition. For use with a pure silver metallization, which has a melting point of 196° C., the dielectric body 12 should fire below about 930° C. By using the ULF dielectric, the metallizations 14, 16 may be applied to the dielectric body 12 while in the green state, and the entire chip can then be cofired. This cofiring technique greatly simplifies the manufacturing process for single layer capacitors.

As further shown in FIG. 1, capacitor 10, having the dissimilar metallizations 14 and 16 in accordance with the present invention, may be effectively mounted to a substrate 18 by a wire bond 20 to top metallization 14 and a conductive epoxy or solder attachment 22 for bottom metallization 16 wherein little to no leaching of gold occurs. It may be noted that while leaching is not a concern when the capacitor 10 is mounted with epoxy, the use of an alloy for bottom metallization 16 allows the capacitors to be manufactured without regard to the method of bonding that will ultimately be used by the customer.

In another embodiment of the present invention, the top metallization 14 is essentially pure silver having less than about 1% non-silver elements, and bottom metallization 16 is a silver alloy having at least about 1% of a leach resistant element, such as platinum, palladium or a combination thereof. Advantageously, platinum or palladium is added in an amount of about 10–20% of the alloy. This silver-based capacitor 10 may then be wire bonded at the top metallization 14 using a silver wire and epoxy or solder bonded at the bottom metallization 16. If the cofiring technique is to be used, dielectric body 12 will comprise a ceramic that fires at less than the melting point of silver, i.e., less than 961° C.

Alternatively, top metallization 14 may comprise essentially pure gold and bottom metallization 16 may comprise a silver alloy. Dielectric body 12 would comprise a ceramic that sinters below the lowest melting point of the top and bottom metallizations 14, 16. This capacitor 10 would wire bond well at the top metallization 15 with a gold wire, and would have a relatively inexpensive bottom metallization 16 that would not leach into solder 22. In a further alternative, top metallization 14 is essentially pure platinum or palladium and bottom metallization 16 is an alloy of Ag, Au, Pt or Pd. If the cofiring technique is to be used, dielectric body 12 has a firing temperature below both metallizations 14, 16. Thus, top metallization 14 is advantageously an essentially pure metal selected from Au, Ag, Pt and Pd and bottom metallization 16 is advantageously one of AuPd, AuPt, AgPd, AgPt, AuPdPt, AgPdPt or AuAgPdPt.

Figure 1A:
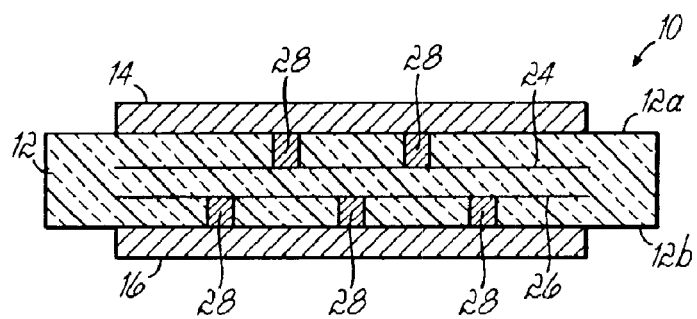
FIG. 1A is an alternative embodiment of the capacitor of FIG. 1, further including interior conductive planes connected to the exterior metallizations through vias.

FIG. 1A depicts in cross-section an alternative embodiment of capacitor 10, which may be effectively mounted in the manner shown in FIG. 1. In FIG. 1A, capacitor 10 includes interior conducting planes 24, 26 electrically connected to the exterior metallizations 14, 16, respectively, by a plurality of vias 28. The vias are filled with a conductive material. Because the capacitance between two conducting planes is inversely proportional to the distance of separation, the capacitance between these interior conducting planes 24, 26—which capacitance is seen at the exterior of the capacitor 10 when these internal planes 24, 26 are electrically connected to the exterior metallizations 14, 16—is greater than the capacitance which would alternatively be seen between opposed exterior metallizations 14, 16 should no electrically connected interior conducting planes 24, 26 be present. Thus, the capacitor 10 of FIG. 1A provides an enhanced capacitance compared to capacitor 10 of FIG. 1 by virtue of the buried internal electrodes and conductive vias. Numerous embodiments exist for capacitors that incorporate these buried internal electrodes and vias, as fully set forth in U.S. patent application Ser. No. 09/875,347, entitled CERAMIC CHIP CAPACITOR OF CONVENTIONAL VOLUME AND EXTERNAL FORM HAVING INCREASED CAPACITANCE FROM USE OF CLOSELY SPACED INTERIOR CONDUCTIVE PLANES RELIABLY CONNECTING TO POSITIONALLY TOLERANT EXTERIOR PADS THROUGH MULTIPLE REDUNDANT VIAS, incorporated by reference herein in its entirety. Any of the capacitor embodiments disclosed therein may be used in the present invention in which dissimilar materials are used for the top and bottom metallizations. Also fully set forth in Ser. No. 09/875,347 is a cofiring method for forming a capacitor 10 in which the metallizations 14 and 16, the internal conductive planes 24 and 26, and the vias 28 are formed on ceramic tape in the green state. An inside-out method may he used, or a bottom-to-top method utilizing a temporary substrate may be used, as described by Ser. No.09/875,347, incorporated by reference herein.

Figure 2:
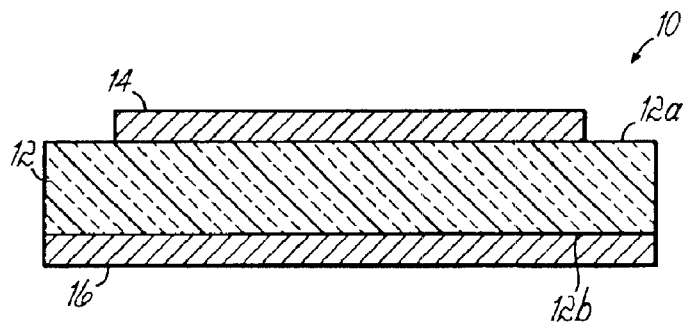
FIGS. 2 and 2A are alternative embodiments of the capacitors of FIGS. 1 and 1A, respectively, wherein the bottom thick film conductor is printed over the full area of the dielectric body.
Figure 2A:
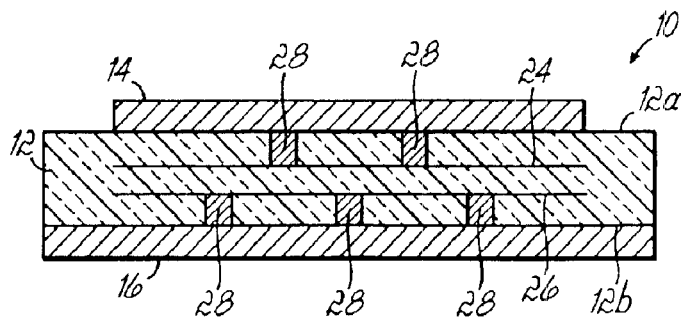

FIGS. 2 and 2A depict in cross-section alternative embodiments for capacitor 10. Capacitor 10 of FIG. 2 differs from capacitor 10 of FIG. 1 and capacitor 10 of FIG. 2A differs from capacitor 10 of FIG. 1A in that bottom metallization 16 is coextensive with bottom coplanar surface 12b, i.e., metallization 16 extends over the full area of the bottom surface 12b of dielectric body 12. Capacitor 10 of FIG. 2 and FIG. 2A may be advantageous for allowing the solder fillet 22 to be visually inspected.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of Applicant's general inventive concept.

What is claimed is:

1. A single layer capacitor comprising:
   a dielectric body having top and bottom opposed coplanar surfaces; and
   top and bottom exterior metallizations on at least a portion of the respective top and bottom opposed coplanar surfaces, wherein the bottom metallization is of lesser purity than the top metallization.

2. The capacitor of claim 1 wherein the top metallization is essentially pure gold comprising less than about 1 wt. % non-gold elements.

3. The capacitor of claim 1 wherein the bottom metallization is an alloy comprising about 80–99% gold and about 1–20% platinum, palladium, or a combination of platinum and palladium.

4. The capacitor of claim 1 wherein the bottom metallization is an alloy comprising about 80–90% gold and about 10–20% platinum, palladium, or a combination of platinum and palladium.

5. The capacitor of claim 1 wherein the top metallization is essentially pure gold comprising less than 1 wt. % non-gold elements, and the bottom metallization comprises gold and at least one alloying metal in an amount sufficient to substantially prevent leaching of the bottom metallization by a molten solder in contact therewith.

6. The capacitor of claim 5 wherein the ceramic has a sintering temperature between about 880° C. and about 960° C.

7. The capacitor of claim 1 wherein the top metallization comprises at least about 99% of a metal selected from the group consisting of Au, Ag, Pt and Pd.

8. The capacitor of claim 7 wherein the bottom metallization comprises an alloy selected from the group consisting of AuPd, AuPt, AgPd, AgPt, AuPdPt, AgPdPt and AuAgPdPt, wherein at least about 1% of the alloy comprises Pd, Pt or PdPt.

9. The capacitor of claim 8 wherein at least about 10% of the alloy comprises Pd, Pt or PdPt.

10. The capacitor of claim 1 further comprising at least one interior conductive plane interior to the dielectric body between the top and bottom exterior metallizations and being more closely situated to the exterior metallizations than the exterior metallizations are to each other, and at least one via located between the at least one interior conductive plane and one of the top and bottom exterior metallizations, the at least one via filled with a conductive material.

11. The capacitor of claim 10 wherein the at least one via includes a multiplicity of vias to permit redundant electrical connections such that the exterior metallization is reliably electrically connected to the interior conductive plane.

12. The capacitor of claim 1 further comprising at least two interior conductive planes interior to the dielectric body between the top and bottom exterior metallizations and being more closely situated to respective exterior metallizations than the exterior metallizations are to each other, and at least one via located between each interior conductive plane and the respective exterior metallization, the vias filled with a conductive material.

13. The capacitor of claim 12 wherein the at least one via includes a multiplicity of vias to permit redundant electrical connections such that each exterior metallization is reliably electrically connected to the respective interior conductive plane.

14. The capacitor of claim 1 wherein the bottom exterior metallization is coextensive with the bottom coplanar surface.

15. The capacitor of claim 1 wherein the dielectric body comprises a ceramic having a sintering temperature below the melting points of the top and bottom metallizations.

16. A single layer capacitor for wire bond and solder attachment comprising:
   a dielectric body having top and bottom opposed coplanar surfaces, the dielectric body comprising a ceramic having a sintering temperature below the melting point of gold;
   top and bottom exterior metallizations on at least a portion of the respective top and bottom opposed coplanar surfaces, wherein the top metallization comprises essentially pure gold and the bottom metallization comprises gold and at least about 10 wt. % platinum, palladium, or a combination of platinum and palladium.

17. The capacitor of claim 16 wherein the ceramic has a sintering temperature between about 880° C. and about 960° C.

18. The capacitor of claim 16 further comprising at least one interior conductive plane interior to the dielectric body between the top and bottom exterior metallizations and being more closely situated to the exterior metallizations than the exterior metallizations are to each other, and at least one via located between the at least one interior conductive plane and one of the top and bottom exterior metallizations, the at least one via filled with a conductive material.

19. The capacitor of claim 18 wherein the at least one via includes a multiplicity of vias to permit redundant electrical connections such that the exterior metallization is reliably electrically connected to the interior conductive plane.

20. The capacitor of claim 16 further comprising at least two interior conductive planes interior to the dielectric body between the top and bottom exterior metallizations and being more closely situated to respective exterior metallizations than the exterior metallizations are to each other, and at least one via located between each interior conductive plane and the respective exterior metallization, the vias filled with a conductive material.

21. The capacitor of claim 20 wherein the at least one via includes a multiplicity of vias to permit redundant electrical connections such that each exterior metallization is reliably electrically connected to the respective interior conductive plane.

22. The capacitor of claim 16 wherein the bottom exterior metallization is coextensive with the bottom coplanar surface.

23. A single layer capacitor for eutectic solder attachment comprising:

a dielectric body having top and bottom opposed coplanar surfaces, the dielectric body comprising a ceramic having a sintering temperature between about 880° C. and about 960° C.;

top and bottom exterior metallizations on at least a portion of the respective top and bottom opposed coplanar surfaces, wherein the top metallization comprises essentially pure gold and the bottom metallization comprises gold and at least about 10 wt. % platinum, palladium, or a combination of platinum and palladium; and at least two interior conductive planes interior to the dielectric body between the top and bottom exterior metallizations and parallel therewith, and at least one via located between each interior conductive plane and the respective exterior metallization, the vias filled with a conductive material.

24. The capacitor of claim 23 wherein the at least one via includes a multiplicity of vias to permit redundant electrical connections such that each exterior metallization is reliably electrically connected to the respective interior conductive plane.

25. The capacitor of claim 23 wherein the bottom exterior metallization is coextensive with the bottom coplanar surface.

* * * * *

UNITED STATES PATENT AND TRADEMARK OFFICE
CERTIFICATE OF CORRECTION

PATENT NO. : 6,917,509 B1
DATED : July 12, 2005
INVENTOR(S) : Devoe et al.

It is certified that error appears in the above-identified patent and that said Letters Patent is hereby corrected as shown below:

Column 4,
Line 9, "196°C" should read -- 961°C --.

Signed and Sealed this

Eighth Day of November, 2005

JON W. DUDAS
*Director of the United States Patent and Trademark Office*